United States Patent
Jeun et al.

(10) Patent No.: US 9,337,427 B2
(45) Date of Patent: May 10, 2016

(54) LASER INDUCED THERMAL IMAGING DEVICE AND LASER INDUCED THERMAL IMAGING METHOD

(71) Applicant: Samsung Display Co., LTD., Yongin, Gyeonggi-do (KR)

(72) Inventors: Jin-Hong Jeun, Yongin (KR); Yuna Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 312 days.

(21) Appl. No.: 14/022,114

(22) Filed: Sep. 9, 2013

(65) Prior Publication Data

US 2014/0307240 A1 Oct. 16, 2014

(30) Foreign Application Priority Data

Apr. 12, 2013 (KR) .................. 10-2013-0040652

(51) Int. Cl.
*H01L 51/00* (2006.01)

(52) U.S. Cl.
CPC ........ *H01L 51/0013* (2013.01); *H01L 51/0031* (2013.01)

(58) Field of Classification Search
None
See application file for complete search history.

(56) References Cited

U.S. PATENT DOCUMENTS

| 5,563,019 A * | 10/1996 | Blanchet-Fincher | B41M 5/38214 430/200 |
|---|---|---|---|
| 7,396,631 B2 * | 7/2008 | Wright | B41M 5/46 427/514 |
| 2004/0002016 A1 * | 1/2004 | Rivers | H01L 51/0013 430/200 |
| 2005/0048862 A1 * | 3/2005 | Phelan | H01L 51/56 445/24 |
| 2008/0048562 A1 * | 2/2008 | Matsuda | H01L 27/3244 313/506 |
| 2011/0133636 A1 * | 6/2011 | Matsuo | H01L 27/3211 313/504 |

FOREIGN PATENT DOCUMENTS

| EP | 1394872 A2 * | 3/2004 | ............. B41M 5/265 |
|---|---|---|---|
| JP | 2009-015240 A | 1/2009 | |
| KR | 10-2011-0011519 A | 2/2011 | |
| KR | 10-2011-0050440 A | 5/2011 | |

* cited by examiner

*Primary Examiner* — Christine Sung
(74) *Attorney, Agent, or Firm* — Lewis Roca Rothgerber Christie LLP

(57) ABSTRACT

A laser induced thermal imaging device includes a substrate stage configured to support a substrate and a donor film; a beam radiation portion configured to emit a laser beam toward the donor film to image an imaging layer of the donor film on a pixel region on the substrate; an error measurement portion configured to determine a position of the laser beam and a position of the pixel region from the donor film to measure a pattern error; and a stage moving portion configured to move the substrate stage in accordance with the pattern error to correct the pattern error.

13 Claims, 9 Drawing Sheets

(A)

(B)

Center of pixel    Center of laser beam

LASER INDUCED THERMAL IMAGING DEVICE AND LASER INDUCED THERMAL IMAGING METHOD

CROSS-REFERENCE TO RELATED APPLICATION

This application claims priority to and the benefit of Korean Patent Application No. 10-2013-0040652 filed in the Korean Intellectual Property Office on Apr. 12, 2013, the entire contents of which are incorporated herein by reference.

BACKGROUND

1. Field

Aspects of embodiments of the present invention relate to a laser induced thermal imaging device and a laser induced thermal imaging method, and more particularly, to a laser induced thermal imaging device and a laser induced thermal imaging method, in which an organic emission layer is formed on a substrate by using a donor film.

2. Description of the Related Art

Recently, a laser induced thermal imaging method using a laser induced thermal imaging device has been used as a method of forming an organic emission layer of an organic light emitting diode display.

The laser induced thermal imaging method is formed of a process of disposing a base film and a donor film constituting a light-heat conversion layer and an imaging layer on a substrate, radiating a laser beam on the donor film to convert light energy of the laser beam into heat energy, imaging the imaging layer on pixel regions on the substrate by using heat energy, and separating the waste donor film on which imaging is completed from the substrate.

Before an imaging process is performed, a position of the laser beam and a position of the pixel region are confirmed through several pre-imagings to correct an error between both. For example, a position confirmation operation may be performed by extracting the waste donor film to confirm the center of the pixel region and the central position of the laser beam using an optical microscope.

However, when using the aforementioned method, there is a technical limitation in that it is difficult to confirm position inferiority (e.g., error or misalignment) of an imaging pattern during an imaging process in mass-production before the position of the laser beam and the position of the pixel region are confirmed from the waste donor film.

The above information disclosed in this Background section is only for enhancement of understanding of the background of the described technology and therefore it may contain information that does not form the prior art that is already known in this country to a person of ordinary skill in the art.

SUMMARY

Embodiments of the present invention have been made in an effort to provide a laser induced thermal imaging device and a laser induced thermal imaging method, in which a position of a laser beam and a position of a pixel region can be automatically precisely compensated for every substrate during an imaging process to prevent or reduce position inferiority (or error or misalignment) of an imaging pattern and ensure a reliable pattern precision.

An exemplary embodiment of the present description provides a laser induced thermal imaging device including: a substrate stage configured to support a substrate and a donor film; a beam radiation portion configured to emit a laser beam toward the donor film to image an imaging layer of the donor film on a pixel region on the substrate; an error measurement portion configured to determine a position of the laser beam and a position of the pixel region from the donor film to measure a pattern error; and a stage moving portion configured to move the substrate stage in accordance with the pattern error to correct the pattern error.

The error measurement portion may include a support on an upper portion of the waste donor film; and a camera on the support and configured to photograph the waste donor film to measure the position of the laser beam and the position of the pixel region.

The laser beam may be scanned along a first direction of the substrate, and the pattern error may be a distance between a center of the laser beam and a center of the pixel region along a second direction crossing the first direction. The stage moving portion may be configured to move the substrate stage along the second direction to the same displacement as the pattern error.

The camera may be coupled to the support by a moving stage configured to move in the second direction and the camera may include an auto-focusing unit. The substrate may be a mother substrate including a plurality of unit cells, and the camera and the moving stage may include a plurality of cameras and a plurality of moving stages arranged on the support along the second direction.

The error measurement portion and the stage moving portion may be electrically connected to a controller, and the controller may be configured to transfer a driving signal to the stage moving portion in accordance with pattern error information provided from the error measurement portion.

Another exemplary embodiment of the present description provides a laser induced thermal imaging method including: laminating a donor film on a substrate mounted on a substrate stage; irradiating a laser beam onto the donor film and performing scanning in a first direduction of the substrate to image an imaging layer of the donor film on pixel regions on the substrate; separating the donor film from the substrate and confirming a position of the laser beam and a position of the pixel region from the separated waste donor film to measure a pattern error; and moving the substrate stage in accordance with the pattern error to correct the pattern error.

An error measurement portion having at least one camera may be arranged adjacent the waste donor film to measure the pattern error. The camera may be movably installed along a second direction crossing the first direction and the camera may include a plurality of cameras arranged along the second direction.

The pattern error may be a distance between a center of the laser beam and a center of the pixel region along the second direction, and the substrate stage may be moved along the second direction by a stage moving portion in accordance with the pattern error.

Measurement of the pattern error and moving the substrate stage in accordance with the pattern error may be automatically performed for a plurality of substrates on which imaging is performed. The substrate may be an organic light emitting display panel prior to forming an organic emission layer thereon, and the imaging layer may be imaged on the pixel regions to form the organic emission layer.

According to exemplary embodiments of the present invention, a feedback of a pattern error measured by an error measurement portion can be provided to a stage moving portion to automatically correct the pattern error. Accordingly, it is possible to automatically and precisely correct positions of pixel regions for every substrate during a thermal imaging process, thereby preventing or reducing position inferiority (or error or misalignment) of an imaging pattern, and ensuring a reliable pattern precision.

DETAILED DESCRIPTION

The exemplary embodiment will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the specification, unless explicitly described to the contrary, the word "comprise" and variations such as "comprises" or "comprising", will be understood to imply the further inclusion of other elements. Further, in the specification, it will be understood that when an element such as a layer, a film, a region, or a substrate is referred to as being "over" or "on" another element, it can be "directly on" the other element or intervening elements may also be present. Further, the word "over" or "on" means positioning on or below the object portion, but does not essentially mean positioning on the upper side of the object portion based on a gravity direction.

Figure 1:
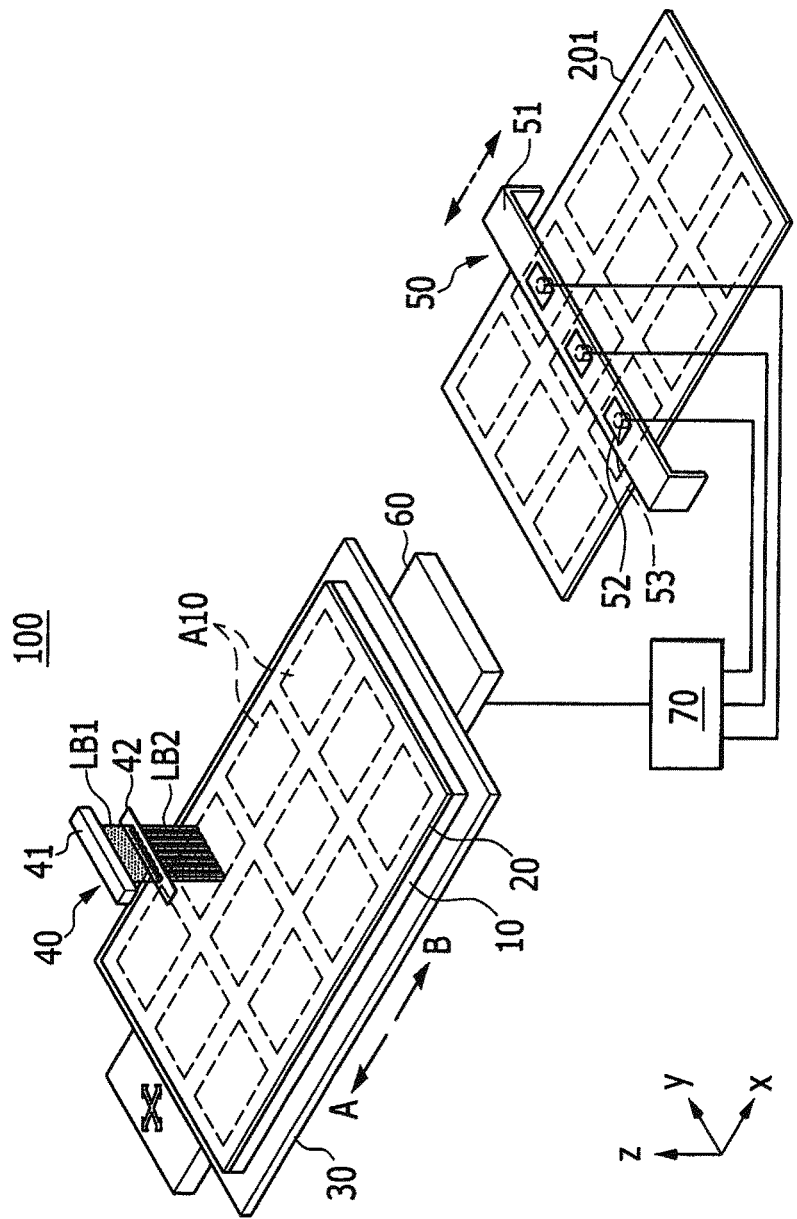
FIG. 1 is a perspective view of a laser induced thermal imaging device according to an exemplary embodiment of the present invention.

FIG. 1 is a perspective view of a laser induced thermal imaging device according to an exemplary embodiment of the present invention.

Referring to FIG. 1, a laser induced thermal imaging device 100 of the present exemplary embodiment includes a substrate stage 30, a beam radiation portion 40, an error measurement portion 50, and a stage moving portion 60. The error measurement portion 50 measures a pattern error from a waste donor film 201, and the stage moving portion 60 moves the substrate stage 30 to displacement corresponding to the pattern error to correct the pattern error.

In more detail, a substrate 10 and a donor film 20 are on the substrate stage 30. Herein, the substrate 10 may be an organic light emitting diode display panel in a step before an organic emission layer is formed, and may be a mother substrate having a plurality of cell regions.

Figure 2:
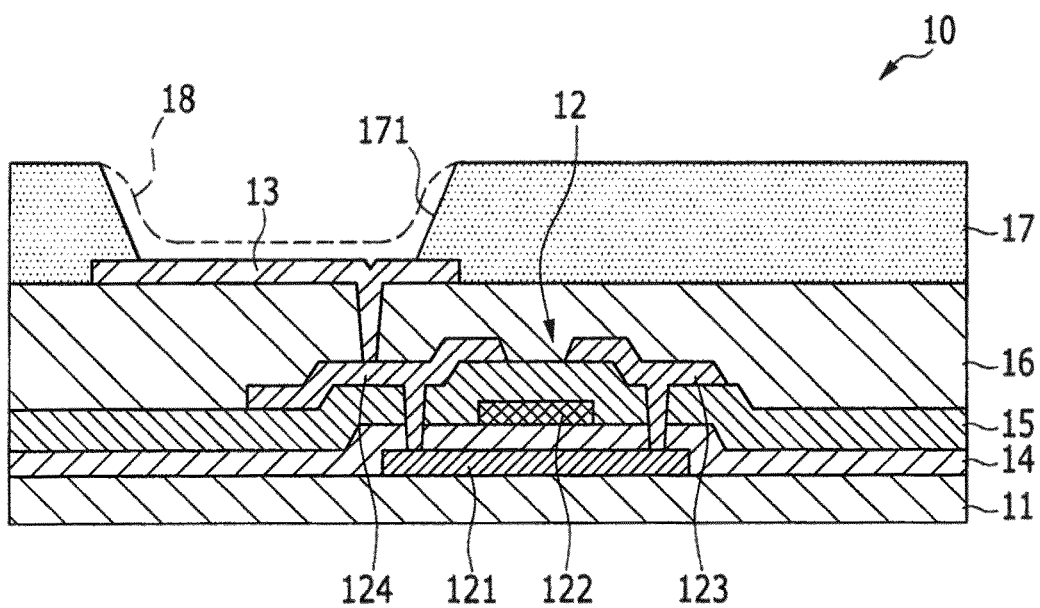
FIG. 2 is a partially expanded cross-sectional view of a substrate illustrated in FIG. 1.
Figure 3:
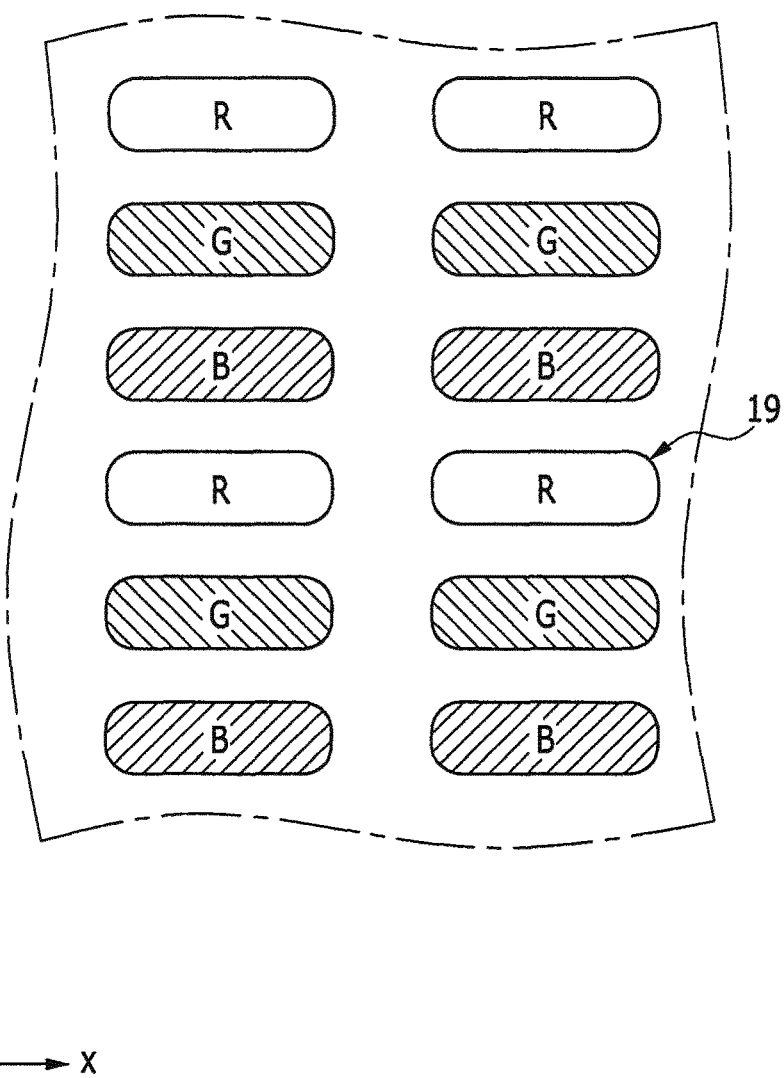
FIG. 3 is a partially expanded top plan view of the substrate illustrated in FIG. 1.

FIG. 2 is a partially expanded cross-sectional view of a substrate illustrated in FIG. 1, and FIG. 3 is a partially expanded top plan view of the substrate illustrated in FIG. 1.

Referring to FIGS. 2 and 3, the substrate 10 (organic light emitting display panel) includes a base substrate 11, a thin film transistor 12, and a pixel electrode 13. The thin film transistor 12 includes a semiconductor layer 121, a gate electrode 122 on the semiconductor layer 121 with a gate insulating layer 14 interposed therebetween, and a source electrode 123 and a drain electrode 124 on the gate electrode 122 with an interlayer insulating layer 15 interposed therebetween.

The source electrode 123 and the drain electrode 124 are covered by a planarization layer 16, and the pixel electrode 13 connected to the drain electrode 124 is on the planarization layer 16. A pixel defining layer 17 partitioning a pixel region is on the pixel electrode 13, and an organic emission layer 18 is formed on the pixel electrode 13 exposed through an opening 171 of the pixel defining layer 17 formed by a laser induced thermal imaging process.

A pixel region 19 includes a red emission layer region (R), a green emission layer region (G), and a blue emission layer region (B), and the pixel electrode 13 is independently positioned for every pixel region on the substrate 10. The pixel region 19 is arranged so that emission layer regions having the same color are arranged along a first direction (x-axis direction of FIG. 3) on the substrate 10 and emission layer regions having different colors are alternately arranged along a second direction (y-axis direction of FIG. 3) crossing the first direction.

Figure 4:
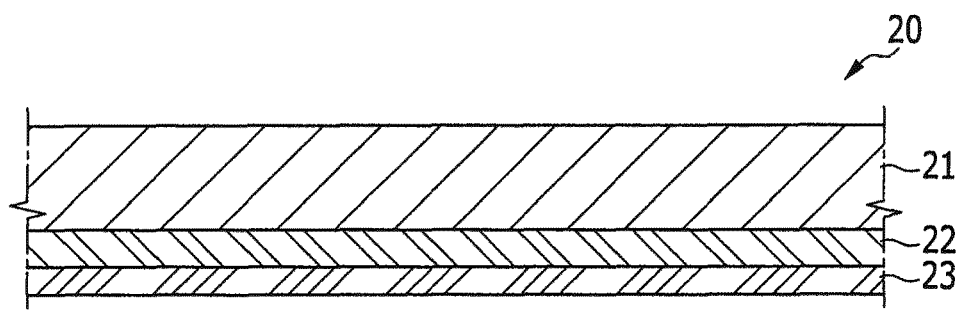
FIG. 4 is an expanded cross-sectional view of a donor film illustrated in FIG. 1.

FIG. 4 is an expanded cross-sectional view of a donor film illustrated in FIG. 1.

Referring to FIG. 4, a donor film 20 includes a base film 21, a light-heat conversion layer 22 formed on the base film 21, and an imaging layer 23 formed on the light-heat conversion layer 22. The donor film 20 is laminated on the substrate 10 so that the imaging layer 23 comes into contact with the pixel defining layer 17.

The base film 21 may be formed of a transparent polymer organic material such as polyethylene terephthalate (PET), polyethylene naphthalate (PEN), polyethylene (PE), or polycarbonate (PC). The light-heat conversion layer 22 serves to convert incident light into heat, and may include aluminum oxide, aluminum sulfide, carbon black, graphite, an infrared dye, or the like that is a light absorptive material. The imaging layer 23 is formed of an organic emission layer material, and has any one color of (or is configured to emit any one of) red, green, and blue colors.

Referring to FIG. 1 again, a beam radiation portion 40 is on an upper portion of a substrate stage 30, and radiates (or irradiates) a laser beam toward the donor film 20. The beam radiation portion 40 includes a laser beam generator 41, an optical mask 42, and an optical system.

Figure 5:
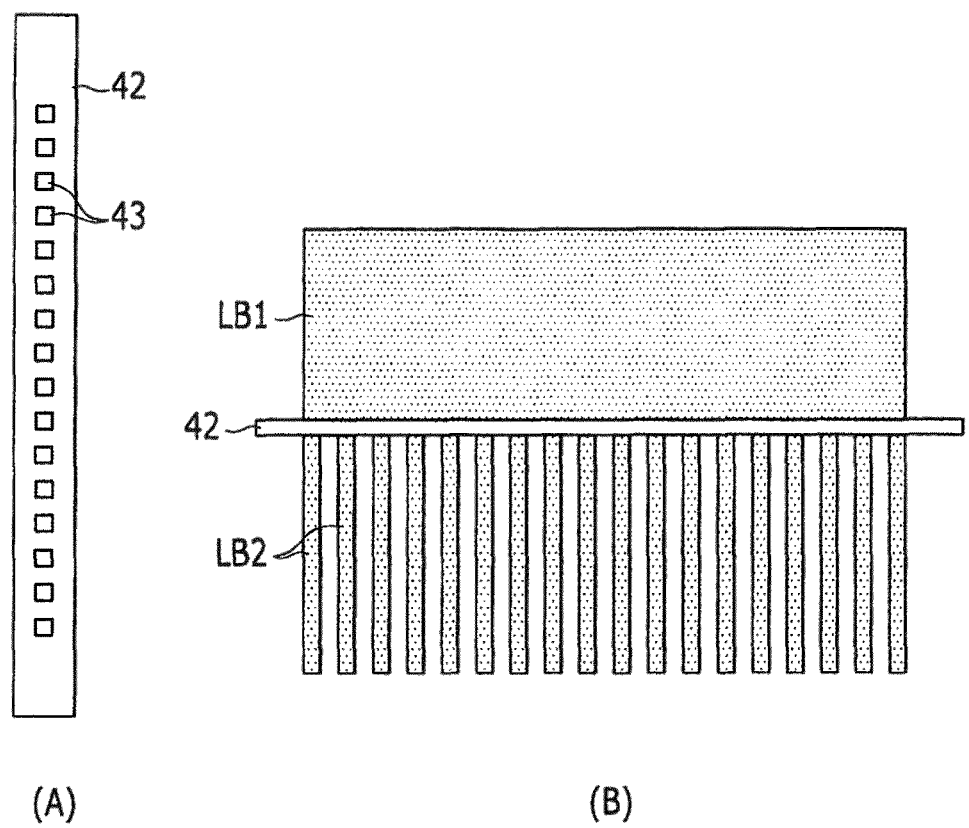
FIG. 5 is a schematic diagram illustrating an optical mask of a beam radiation portion illustrated in FIG. 1.

FIG. 5 is a schematic diagram illustrating an optical mask of a beam radiation portion illustrated in FIG. 1.

Referring to FIGS. 1 and 5, a plurality of imaging pattern portions 43 is formed on the optical mask 42, through which an initial laser beam (LB1) passes to partition the initial laser beam into a plurality of imaging laser beams (LB2). A plurality of partitioned imaging laser beams (LB2) is radiated (or irradiated) onto the donor film 20 and used to image the imaging layer 23 of the donor film 20 on the pixel electrode 13.

The imaging pattern portions 43 are arranged in the second direction (y-axis direction) on the substrate 10, and each imaging pattern portion 43 corresponds to the emission layer region 19 having any one color of the emission layer regions 19 having three colors illustrated in FIG. 3. The optical mask 42 may be formed in a size corresponding to any one cell region (A10) of a plurality of cell regions (e.g., predetermined cell regions) (A10) on the mother substrate.

Referring to FIG. 1, the stage moving portion 60 is combined with the substrate stage 30 to move the substrate stage 30 along the first direction (x-axis direction) and the second direction (y-axis direction). Because constitution and operation of the stage moving portion 60 are technologies known to the person of an ordinary skill in the art, a detailed description thereof will be omitted herein.

While the beam radiation portion 40 radiates the imaging laser beam (LB2) onto the donor film 20, the substrate stage 30 is moved in the first direction (x-axis direction) by the stage moving portion 60. In FIG. 1, the arrow A represents a moving direction of the substrate stage 30, and the arrow B represents a scan direction of the imaging laser beam. Because the imaging laser beam (LB2) is partitioned by the imaging pattern portion 43 of the optical mask 42, the donor film 20 receives the imaging laser beam (LB2) for only a region on which the imaging layer 23 is to be imaged.

In the light-heat conversion layer 22 of the donor film 20, a portion receiving the imaging laser beam (LB2) is expanded (or expands) toward the substrate 10, and the imaging layer 23 is expanded (or expands) together therewith. In addition, the expanded portion of the imaging layer 23 is separated from the base film 21 to be imaged on the pixel electrode 13.

In the case where the optical mask 42 is formed in a size (or has a size) corresponding to one cell region, the organic emission layers 18 having one color may be sequentially formed for a plurality of cell regions that are adjacent in the first direction (x-axis direction). Thereafter, the substrate stage 30 is moved in the second direction (y-axis direction) to position the cell region at another row beneath the beam radiation portion 40, and the substrate stage 30 is moved again in the first direction to perform scanning of the imaging laser beam (LB2) and imaging of the imaging layer 23 according thereto (e.g., according to the new position).

After the imaging is completed, the substrate 10 and the donor film 20 are transferred to a peeling process, and the donor film 20 is separated from the substrate 10. The error measurement portion 50 is positioned on the waste donor film 201 and measures the pattern error from the waste donor film 201.

Figure 6:
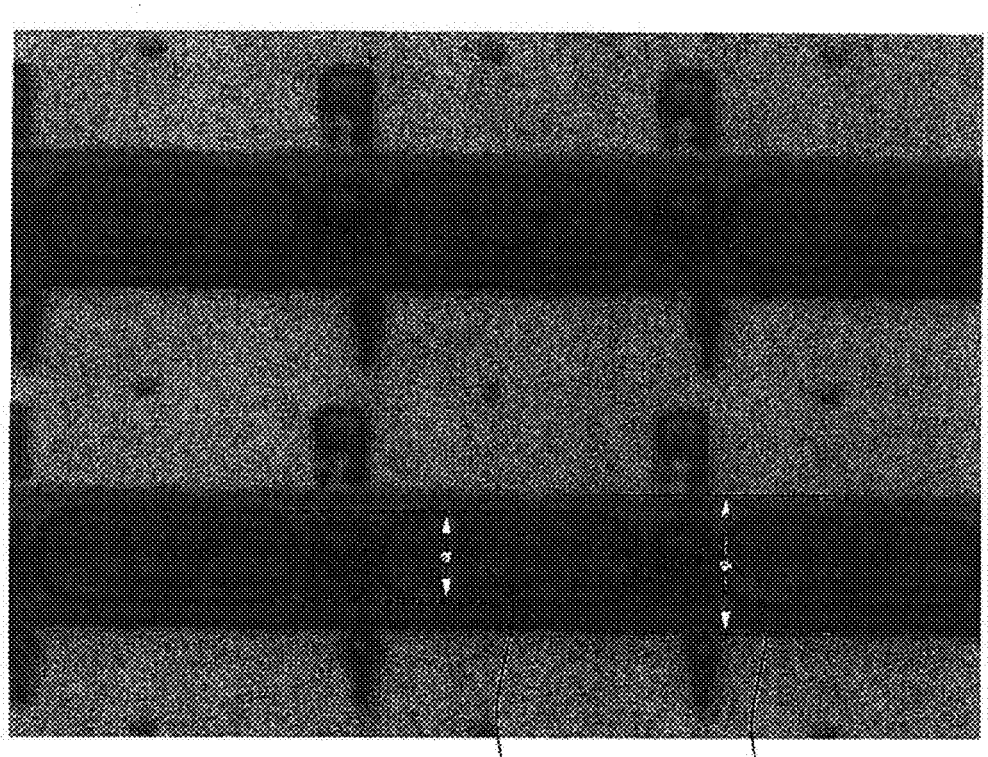
FIG. 6 is an expanded picture of a waste donor film illustrated in FIG. 1.

FIG. 6 is an expanded picture of a waste donor film illustrated in FIG. 1.

Referring to FIGS. 1 and 6, a linear laser trace according to the scanning of the imaging laser beam (LB2) remains in the waste donor film 201, and an imaging trace of the imaging layer 23 corresponding to the opening 171 of the pixel defining layer 17 remains in the laser trace.

A central position of the laser beam may be confirmed from the laser trace of the waste donor film 201, and a central position of the pixel region 19 ('center of the pixel' in FIG. 6) may be confirmed from the imaging trace. A distance between the center of the laser beam and the center of the pixel region according to the second direction (y-axis direction) is measured and becomes (or is interpreted as) the pattern error.

Referring to FIG. 1, the error measurement portion 50 includes a support 51 on (or over) an upper portion of the waste donor film 201, a plurality of moving stages 52 on (or installed on) the support 51, and a plurality of cameras 53 individually on (or installed in) a plurality of moving stages 52.

The support 51 is arranged (or installed) in (or along) a direction that is parallel to the second direction (y-axis direction) of the waste donor film 201, and may be moved along the first direction (x-axis direction). A plurality of moving stages 52 are arranged in the second direction on the support 51 while being spaced apart from each other, and each moving stage 52 is independently movably installed along the second direction. Because constitution of the moving stage 52 is a technology known to the person of an ordinary skill in the art, a detailed description thereof will be omitted.

The camera 53 is on (or positioned on) a lower side of the moving stage 52 facing toward the waste donor film 201, and has an auto-focusing unit to automatically focus in one region on the waste donor film 201 for measuring the pattern error. In one embodiment, a plurality of cameras 53 is mounted on the support 51, and thus the pattern errors may be concurrently (e.g., simultaneously) measured for two or more different cell regions and a time required to inspect the pattern may be shortened.

The camera 53 is a high resolution region camera, and may search a plurality of pixel regions 19 to measure the pattern error in each of a plurality of pixel regions 19. The error measurement portion 50 and the stage moving portion 60 are electrically connected to the controller 70. The error measurement portion 50 transfers pattern error information to the controller 70, and the controller 70 controls driving of the stage moving portion 60 based on the pattern error information. In this case, the pattern error information may be an average value of the pattern errors measured in a plurality of pixel regions 19.

Figure 7:
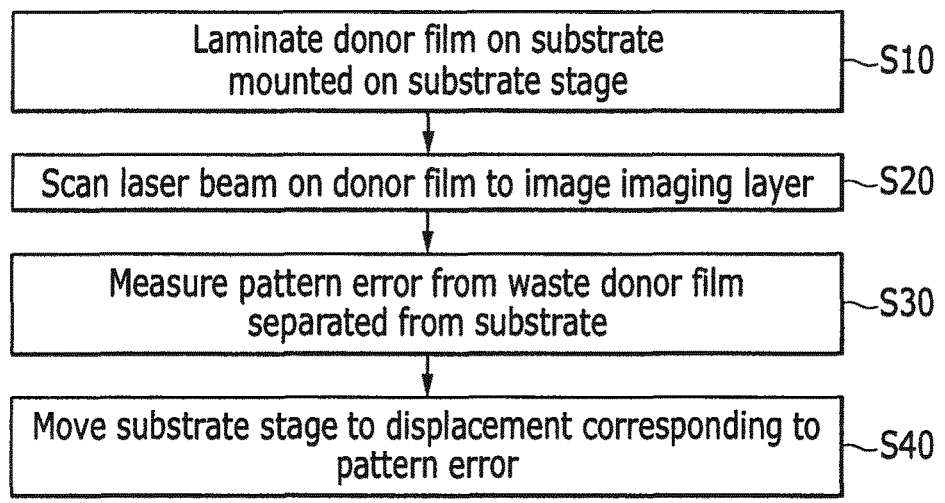
FIG. 7 is a process flowchart illustrating a laser induced thermal imaging method according to one exemplary embodiment of the present invention.

FIG. 7 is a process flowchart illustrating a laser induced thermal imaging method according to the exemplary embodiment.

Referring to FIG. 7, the laser induced thermal imaging method includes laminating a donor film on a substrate mounted on a substrate stage (S10), and radiating a laser beam on the donor film and performing scanning in a first direction to image an imaging layer on pixel regions on the substrate (S20). Further, the laser induced thermal imaging method includes measuring a pattern error from the waste donor film separated from the substrate (S30), and moving the substrate stage to displacement corresponding to the pattern error to correct the pattern error (S40).

Figure 8:
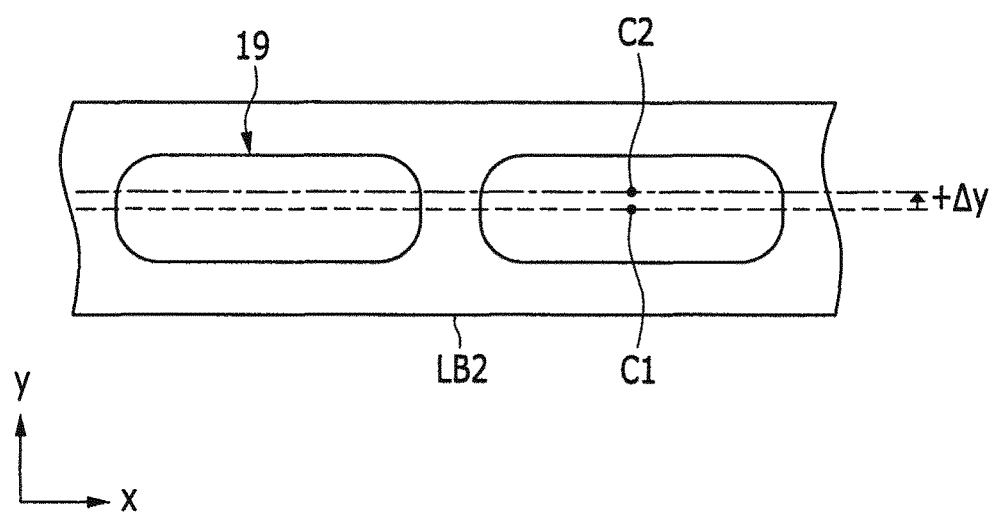
FIGS. 8 and 9 are schematic diagrams illustrating a pattern error of the waste donor film.
Figure 9:
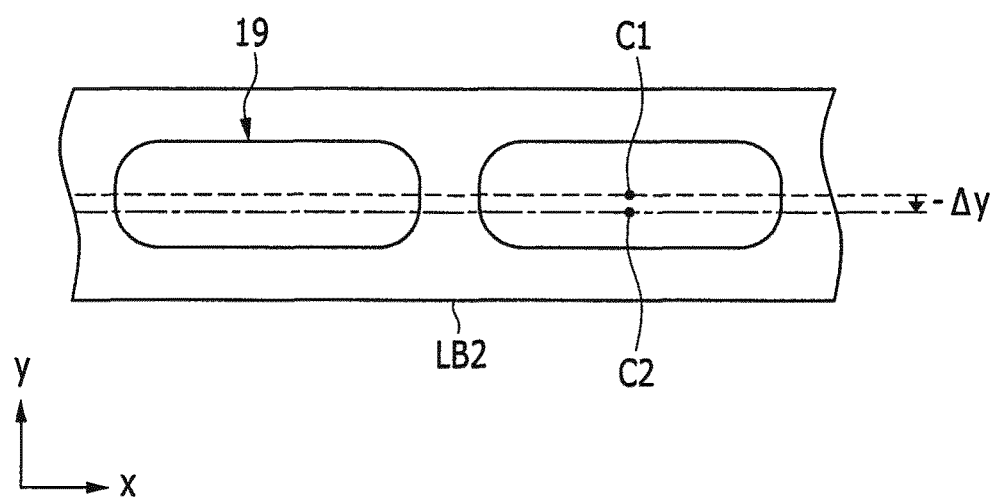

FIGS. 8 and 9 are schematic diagrams illustrating a pattern error of the waste donor film according to exemplary embodiments of the present invention.

For example, referring to FIG. 8, in measuring the pattern error (S30), an error measurement portion 50 may photograph a waste donor film 201 to measure that a center (C2) of the imaging laser beam (LB2) has a pattern error of $+\Delta y$ to a center (C1) of a pixel region 19.

In this case, in moving the substrate stage (S40), the controller 70 transfers a driving signal of $+\Delta y$ corresponding to the pattern error to a stage moving portion 60. Then, the stage moving portion 60 moves the substrate stage 30 by $+\Delta y$ to allow the center of the pixel region 19 and the center of the imaging laser beam (LB2) to be aligned (e.g., to be identical).

As another example, referring to FIG. 9, in the measuring the pattern error (S30), the error measurement portion 50 may photograph the waste donor film 201 to measure that the center (C2) of the imaging laser beam (LB2) has a pattern error of $-\Delta y$ to the center (C1) of the pixel region 19.

In this case, in the fourth step (S40), the controller 70 transfers a driving signal of $-\Delta y$ corresponding to the pattern error to the stage moving portion 60. Then, the stage moving portion 60 moves the substrate stage 30 by $-\Delta y$ to allow the center of the pixel region 19 and the center of the imaging laser beam (LB2) to be aligned (e.g., to be identical).

As described above, according to the present exemplary embodiments, a feedback of the pattern error measured by the error measurement portion 50 is provided to the stage moving portion 60 to automatically correct for the pattern error. In this case, error measurement of the error measurement portion 50 and error correcting of the stage moving portion 60 may be automatically performed for every substrate 10 on which imaging is performed. Accordingly, it is possible to automatically and precisely correct positions of pixel regions 19 for every substrate 10 during a thermal imaging process, thereby preventing or reducing position inferiority or errors of the imaging pattern and ensuring or increasing reliable pattern precision.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

| Description of symbols | |
|---|---|
| 100: Laser induced thermal imaging device | 10: substrate |
| 20: Donor film | 201: Waste donor film |
| 30: Substrate stage | 40: Beam radiation portion |
| 50: Error measurement portion | 60: Stage moving portion |
| 70: Controller | |

What is claimed is:

1. A laser induced thermal imaging device comprising:
   a substrate stage configured to support a substrate and a donor film;
   a beam radiation portion configured to emit a laser beam toward the donor film to image an imaging layer of the donor film on a pixel region on the substrate and to form a waste donor film from the donor film;
   an error measurement portion configured to measure a pattern error using the waste donor film by determining a position of the laser beam and a position of the pixel region from the waste donor film separated from the substrate; and
   a stage moving portion configured to move the substrate stage in accordance with the pattern error to correct the pattern error.

2. The laser induced thermal imaging device of claim 1, wherein the error measurement portion comprises:
   a support on an upper portion of the waste donor film; and
   a camera on the support and configured to photograph the waste donor film to measure the position of the laser beam and the position of the pixel region.

3. The laser induced thermal imaging device of claim 2, wherein the laser beam is scanned along a first direction of the substrate, and
   wherein the pattern error is a distance between a center of the laser beam and a center of the pixel region along a second direction crossing the first direction.

4. The laser induced thermal imaging device of claim 3, wherein the stage moving portion is configured to move the substrate stage along the second direction to the same displacement as the pattern error.

5. The laser induced thermal imaging device of claim 3, wherein the camera is coupled to the support by a moving stage configured to move along the second direction, and
   wherein the camera comprises an auto-focusing unit.

6. The laser induced thermal imaging device of claim 5, wherein the substrate is a mother substrate comprising a plurality of unit cells, and
   wherein the camera and the moving stage comprise a plurality of cameras and a plurality of moving stages arranged on the support along the second direction.

7. The laser induced thermal imaging device of claim 1, wherein the error measurement portion and the stage moving portion are electrically connected to a controller, and
   wherein the controller is configured to transfer a driving signal to the stage moving portion in accordance with pattern error information provided from the error measurement portion.

8. A laser induced thermal imaging method comprising:
   laminating a donor film on a substrate mounted on a substrate stage;
   irradiating a laser beam onto the donor film and performing scanning in a first direction of the substrate to image an imaging layer of the donor film on pixel regions on the substrate and to form a waste donor film from the donor film;
   separating the waste donor film from the substrate and confirming a position of the laser beam and a position of the pixel region from the separated waste donor film to measure a pattern error; and
   moving the substrate stage in accordance with the pattern error to correct the pattern error.

9. The laser induced thermal imaging method of claim 8, wherein an error measurement portion having at least one camera is arranged adjacent the waste donor film to measure the pattern error.

10. The laser induced thermal imaging method of claim 9, wherein the camera is movably installed along a second direction crossing the first direction and
    wherein the camera comprises a plurality of cameras arranged along the second direction.

11. The laser induced thermal imaging method of claim 10, wherein the pattern error is a distance between a center of the laser beam and a center of the pixel region along the second direction, and
    wherein the substrate stage is moved along the second direction by a stage moving portion in accordance with the pattern error.

12. The laser induced thermal imaging method of claim 8, wherein measurement of the pattern error and moving the substrate stage in accordance with the pattern error are automatically performed for a plurality of substrates on which imaging is performed.

13. The laser induced thermal imaging method of claim 8, wherein the substrate is an organic light emitting display panel prior to forming an organic emission layer thereon, and
    the imaging layer is imaged on the pixel regions to form the organic emission layer.

* * * * *